United States Patent [19]

Kunieda et al.

[11] Patent Number: 4,921,810

[45] Date of Patent: May 1, 1990

[54] METHOD FOR TESTING SEMICONDUCTOR DEVICES

[75] Inventors: Shin-ichi Kunieda, Sacramento; Masahide Ozawa, Citrus Heights, both of Calif.

[73] Assignee: NEC Electronics Inc., Mountain View, Calif.

[21] Appl. No.: 209,758

[22] Filed: Jun. 22, 1988

[51] Int. Cl.$^5$ ............................................. H01L 21/66
[52] U.S. Cl. ................................... 437/8; 324/158 R
[58] Field of Search ............... 437/8, 227; 324/158 R

[56] References Cited

U.S. PATENT DOCUMENTS 4,760,032  7/1988  Turner ................................... 437/8

FOREIGN PATENT DOCUMENTS

| 0016522 | 10/1980 | European Pat. Off. | ................ 437/8 |
| 53-148963 | 12/1978 | Japan | ........................................ 437/8 |
| 54-101677 | 8/1979 | Japan | ........................................ 437/8 |
| 54-152868 | 12/1979 | Japan | ........................................ 437/8 |
| 55-110052 | 8/1980 | Japan | ........................................ 437/8 |
| 55-110053 | 8/1980 | Japan | ........................................ 437/8 |
| 55-163855 | 12/1980 | Japan | ........................................ 437/8 |
| 61-74347 | 4/1986 | Japan | ........................................ 437/8 |
| 62-211933 | 9/1987 | Japan | ........................................ 437/8 |

*Primary Examiner*—Olik Chaudhuri
*Attorney, Agent, or Firm*—Skjerven, Morrill, MacPherson, Franklin & Friel

[57] ABSTRACT

A method for electrically testing integrated circuits in a wafer comprises the steps of forming a layer of material (20) on the surface of the wafer having a dielectric constant which simulates the dielectric constant of the packaging material which will eventually encapsulate the integrated circuits. In one embodiment, photoresist is formed on the integrated circuit prior to wafer test. In this way, during wafer test, the capacitive coupling between the conductive structures (14) in the integrated circuit will accurately simulate the capacitive coupling between these structures after the integrated circuit is encapsulated in the packaging material.

7 Claims, 1 Drawing Sheet

METHOD FOR TESTING SEMICONDUCTOR DEVICES

BACKGROUND OF THE INVENTION

This invention relates to methods for testing semiconductor devices and more specifically to methods for testing integrated circuits.

During manufacturing, a set of integrated circuits is formed in a semiconductor wafer. After the integrated circuits are formed in the wafer, each circuit within the wafer is tested. Thereafter, the wafer is cut into individual integrated circuits. The circuits which have failed the test are discarded, while the circuits which have passed the test are placed in packages, e.g. dual in-line packages, chip carrier packages, etc. The packaged integrated circuits are then subjected to a final electrical test.

Unfortunately, the results of tests at the wafer level do not always accurately predict how circuits will function at final test. One reason for this is the difference in the dielectric constant of air and mold resin. During wafer test, the top surfaces of the wafers are exposed to air but during final testing, the integrated circuits are assembled into packages, for example, molded plastic packages. Because of this difference in test conditions, the capacitive coupling between two adjacent aluminum, polysilicon or other electrical connection lines in the integrated circuit is different during wafer sort and final test. This difference in capacitive coupling can affect the electrical performance of the integrated circuit.

SUMMARY OF THE INVENTION

We have discovered that the above-mentioned problem can be solved by placing a material on the wafer surface which has a dielectric constant that approximates the dielectric constant of the material that the integrated circuit is to eventually be packaged in. In one embodiment, this material is photoresist when the integrated circuit is to be packaged in a conventional plastic package. In this way, the electrical tests performed on the wafer will more accurately predict how the circuit will function when finally packaged.

DETAILED DESCRIPTION

Figure 1:
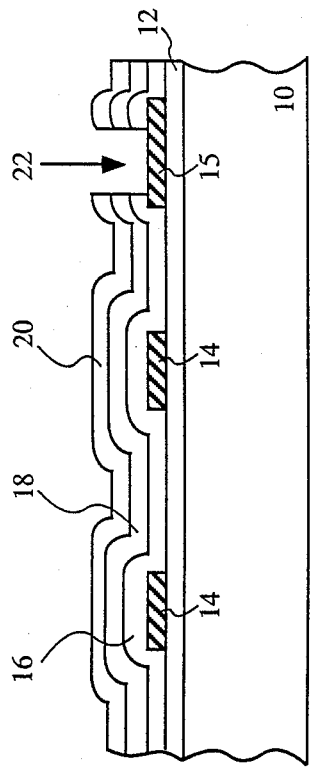
FIG. 1 illustrates in cross section an integrated circuit prior to wafer test.

FIG. 1 illustrates in cross section a portion of an integrated circuit immediately prior to wafer test. The integrated circuit includes a semiconductor substrate 10 (typically silicon) and an insulating layer 12 (typically silicon dioxide) formed on substrate 10. Conductive leads 14 (typically aluminum, an alloy of aluminum, polysilicon, a silicide, or other conductive materials) are formed on insulating layer 12. A bonding pad 15 (typically a metal such as aluminum or an aluminum alloy) is also formed on insulating layer 12. Typically, insulating layer 12 includes openings (not shown) where conductive leads 14 electrically contact various N and P type regions formed in substrate 10.

Formed over the wafer are insulating/passivating layers 16 and 18. In one embodiment, layer 16 is phosphorus-doped silicon dioxide formed to a thickness of about 10,000 Å while layer 18 is silicon nitride formed to a thickness of 5,000 Å. Layers 16 and 18 are typically formed by chemical vapor deposition. Formed over layer 18 is a photoresist layer 20.

Of importance, layers 16, 18 and 20 include a window region 22 for exposing bonding pad 15. Window region 22 is formed to permit electrical contact to the bonding pad during wafer testing, and during packaging.

In one embodiment of the invention, photoresist layer 20 is the photoresist layer used to pattern layers 16 and 18 (i.e., the photoresist layer used to form window region 22 in layers 16 and 18 over bonding pad 15). However, in another embodiment of the invention, after layers 16 and 18 are deposited on the wafer, a first photoresist layer (not shown) is applied to the wafer and then patterned to expose the portion of layer 18 over bonding pad 15, the exposed portion of layer 18 and the portion of layer 16 thereunder are removed, the first photoresist layer is removed from the wafer, photoresist layer 20 is then applied to the wafer, and then photoresist layer 20 is patterned to expose the bonding pad. In one embodiment, photoresist layer 20, which can be any conventional positive or negative resist, is between 1 and 4 microns thick. (If photoresist layer 20 is too thin, it may not completely cover the wafer. Also, if formed too thin, the affect of photoresist layer 20 on the capacitance of the structures formed in the wafer may be attenuated. However, in other embodiments, layer 20 can be less than 1 micron thick.)

The structure of FIG. 1 is then subjected to wafer test. Of importance, the dielectric constants of phosphorus-doped silicon dioxide layer 16, silicon nitride layer 18 and photoresist layer 20 are about 4, 8 and 6 respectively. The dielectric constant of air is 1 and the dielectric constant of mold plastic is typically 4. Thus, the addition of photoresist layer 20 to the top surface of the wafer alters the capacitive coupling between conductive leads 14 and thus electrical testing of the wafer more accurately simulates the electrical performance of the device when the integrated circuit is encapsulated within a molded plastic package.

Although it is desirable that layer 20 have a dielectric constant equal to the dielectric constant of the material used to package the circuit, materials having dieletric constants which are greater than the dielectric constant of air, but less than the dielectric constant of the packaging material, fall within the scope of our invention. Thus, for example, an embodiment where the packaging material dielectric constant is 4, and the dielectric constant of layer 20 is 2, falls within the scope of one embodiment of our invention.

After wafer test, photoresist layer 20 is removed and the wafer is cut into individual integrated circuits. The individual integrated circuits which passed wafer test are then placed in a plastic package. At the conclusion of this step, the integrated circuit is encapsulated in plastic. In one embodiment, this plastic is a novolac type epoxy resin. Of importance, this plastic typically has a dielectric constant of 4. Thus, the capacitive coupling between aluminum structures 14 after the device is packaged approximates the capacitive coupling between aluminum structures 14 during wafer test.

After the device is packaged, the circuits are subjected to a final electrical test. If the device passes final test, it is shipped to a customer.

Although the above process uses molded plastic having a dielectric constant of 4, in other embodiments, other materials encapsulate the integrated circuit. Thus, in another embodiment of the invention, materials other than photoresist 20 are deposited on the wafer to accurately simulate the dielectric properties of the packaging material to be used. These materials can include phenol resin ($\epsilon o$ is between about 5 and 7), silicone resin ($\epsilon o$ is between 3 and 5), and epoxy resin ($\epsilon o$ is between 3 and 5). In addition, materials other than novolac type resin, e.g., a silicone resin, can be used to package the integrated circuit.

While the invention has been described with regard to a specific embodiment, those skilled in the art will recognize that changes can be made in form and detail without departing from the spirit and scope of the invention. For example, the above-described method could be used to test both bipolar and MOS integrated circuits. In addition, the above method could be used to test integrated circuits formed in semiconductor materials other than silicon, e.g. gallium arsenide. Accordingly, all such changes come within the scope of the present invention.

We claim:

1. A method for testing an integrated circuit comprising the steps of:
    applying a layer of material to a surface of said integrated circuit, said layer of material having a dielectric constant greater than 1;
    electrically testing said integrated circuit, the electrical test including effects of capacitive coupling;
    removing said layer of material from said surface of said integrated circuit; and
    packaging said integrated circuit.

2. The method of claim 1 wherein said layer of material comprises photoresist.

3. The method of claim 1 wherein said layer of material has a dielectric constant greater than 2.

4. The method of claim 1 wherein said layer of material has a dielectric constant of about 6.

5. The method of claim 1 wherein said integrated circuit includes an insulating layer formed thereon, said insulating layer comprising at least one of the materials within the class of materials consisting of silicon dioxide and silicon nitride, said layer of material being formed on said insulating layer.

6. The method of claim 1 wherein said layer of material is greater than about 1 micron thick.

7. A method for testing integrated circuits in a wafer comprising the steps of:
    applying a layer of material to a surface of said wafer, said layer of material having a dielectric constant greater than 1;
    electrically testing the integrated circuit within said wafer, the electrical test including effects of capacitive coupling;
    removing said layer of material from said surface of said wafer;
    cutting said wafer into individual integrated circuits; and
    packaging said integrated circuits.

* * * * *